US007141472B2

(12) United States Patent
Hermes

(10) Patent No.: US 7,141,472 B2
(45) Date of Patent: Nov. 28, 2006

(54) SEMICONDUCTOR PROCESSING METHODS OF FORMING DYNAMIC RANDOM ACCESS MEMORY (DRAM) CIRCUITRY

(75) Inventor: Mike Hermes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 203 days.

(21) Appl. No.: 10/611,602

(22) Filed: Jun. 30, 2003

(65) Prior Publication Data

US 2004/0092071 A1    May 13, 2004

Related U.S. Application Data

(63) Continuation of application No. 09/139,691, filed on Aug. 25, 1998, now Pat. No. 6,596,577.

(51) Int. Cl.
*H01L 21/76* (2006.01)
(52) U.S. Cl. .............. 438/241; 438/243; 438/266; 257/E21.66
(58) Field of Classification Search .......... 438/241, 438/396, 250, 258, 253, 711, 712, 243, 266; 257/E21.66
See application file for complete search history.

(56) References Cited

U.S. PATENT DOCUMENTS

| | | | |
|---|---|---|---|
| 5,292,677 A | 3/1994 | Dennison | |
| 5,364,811 A | 11/1994 | Ajika et al. | |
| 5,508,219 A * | 4/1996 | Bronner et al. | 438/152 |
| 5,523,596 A | 6/1996 | Ohi et al. | |
| 5,612,238 A | 3/1997 | Sato et al. | |
| 5,612,241 A | 3/1997 | Arima | |
| 5,644,151 A | 7/1997 | Izumi et al. | |
| 5,716,862 A | 2/1998 | Ahmad et al. | |
| 5,731,234 A | 3/1998 | Chen | |
| 5,872,048 A | 2/1999 | Reinberg | |
| 5,879,981 A | 3/1999 | Tanigawa | |
| 5,920,775 A | 7/1999 | Koh | |
| 6,153,476 A | 11/2000 | Inabs et al. | |

* cited by examiner

*Primary Examiner*—Michael Lebentritt
*Assistant Examiner*—Ron Pompey
(74) *Attorney, Agent, or Firm*—Wells St. John P.S.

(57) ABSTRACT

Methods of forming dynamic random access memories (DRAM) are described. In one embodiment, an insulative layer is formed over a substrate having a plurality of conductive lines which extend within a memory array area and a peripheral area outward of the memory array. Capacitor container openings and contact openings are contemporaneously etched over the memory array and conductive line portions within the peripheral area respectively. In another embodiment, a patterned masking layer is formed over a substrate having a plurality of openings formed within an insulative layer, wherein some of the openings comprise capacitor container openings within a memory array and other of the openings comprise conductive line contact openings disposed over conductive lines within a peripheral area outward of the memory array. With a common patterned masking layer, unmasked portions of a capacitor electrode layer are removed within the memory array and material from over portions of the conductive lines within the peripheral area is removed sufficient to expose conductive material of the conductive line portions. In yet another embodiment, a common etch chemistry is used to remove selected material of an insulative material layer formed over conductive lines within a peripheral area and material of a storage capacitor electrode layer. In yet another embodiment, a plurality of conductive plugs are formed over substrate node locations over which storage capacitors are to be formed. After forming the plugs, insulative material over conductive lines within a peripheral area is removed to first expose conductive material of the conductive lines.

6 Claims, 8 Drawing Sheets

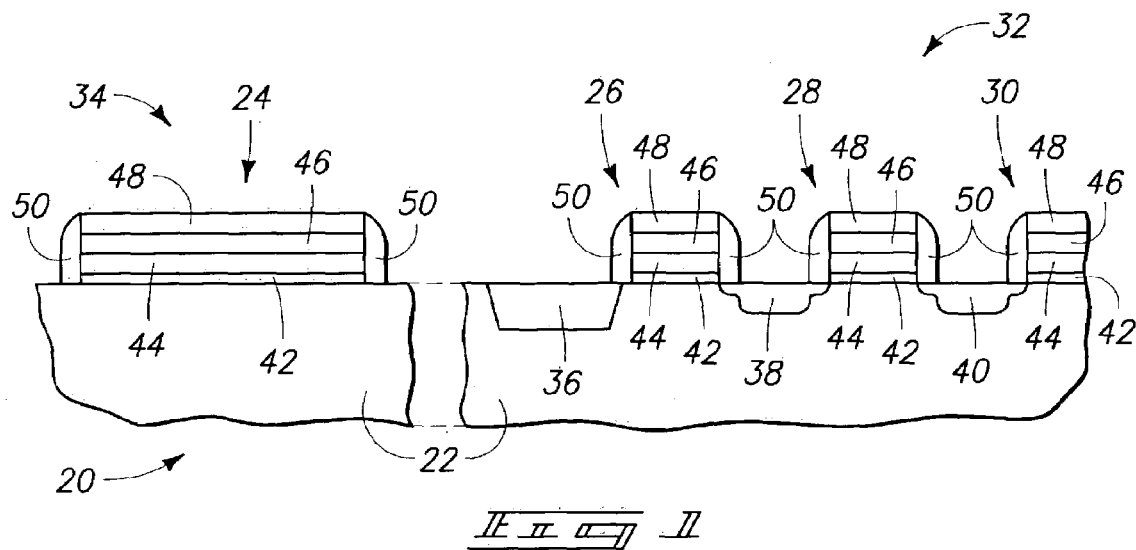
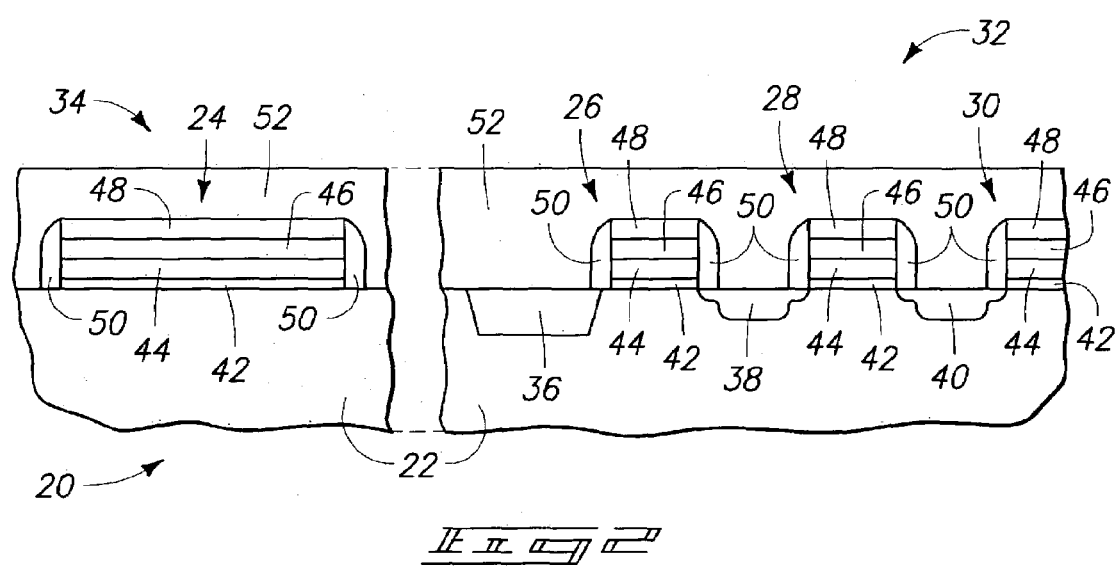

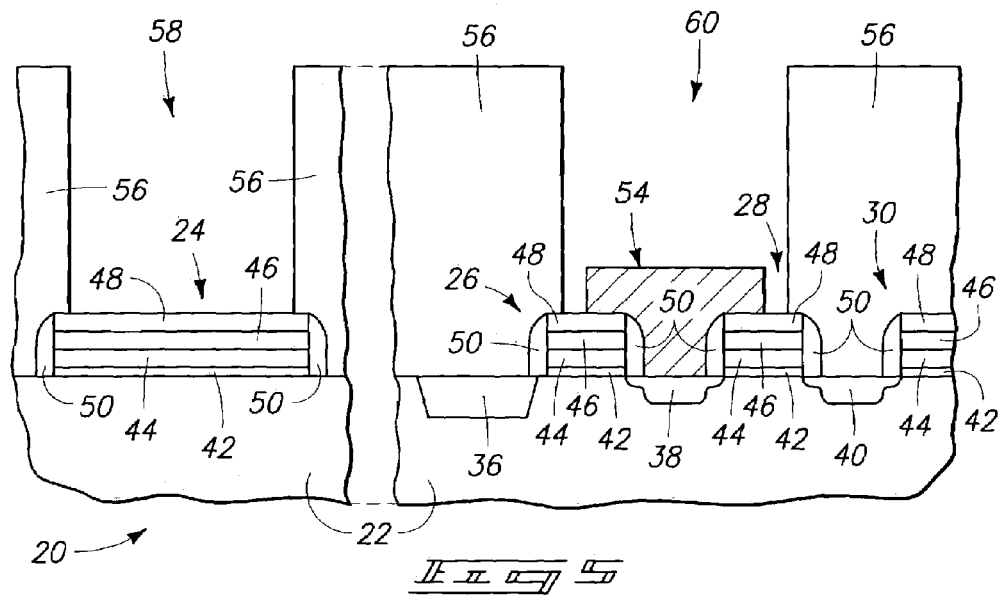
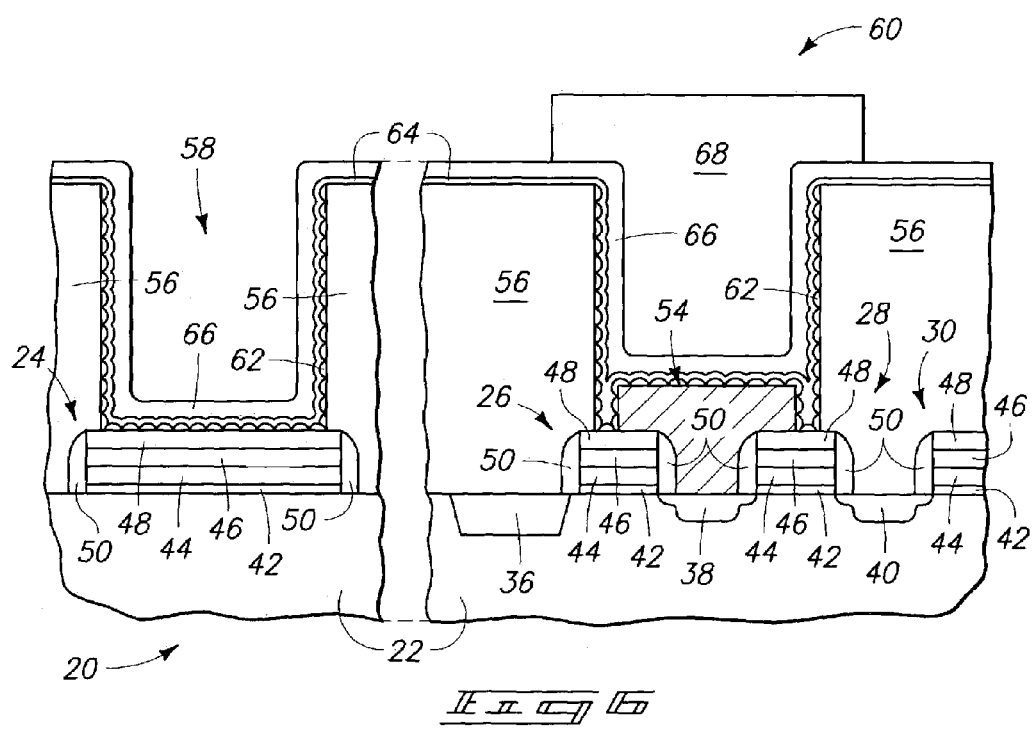

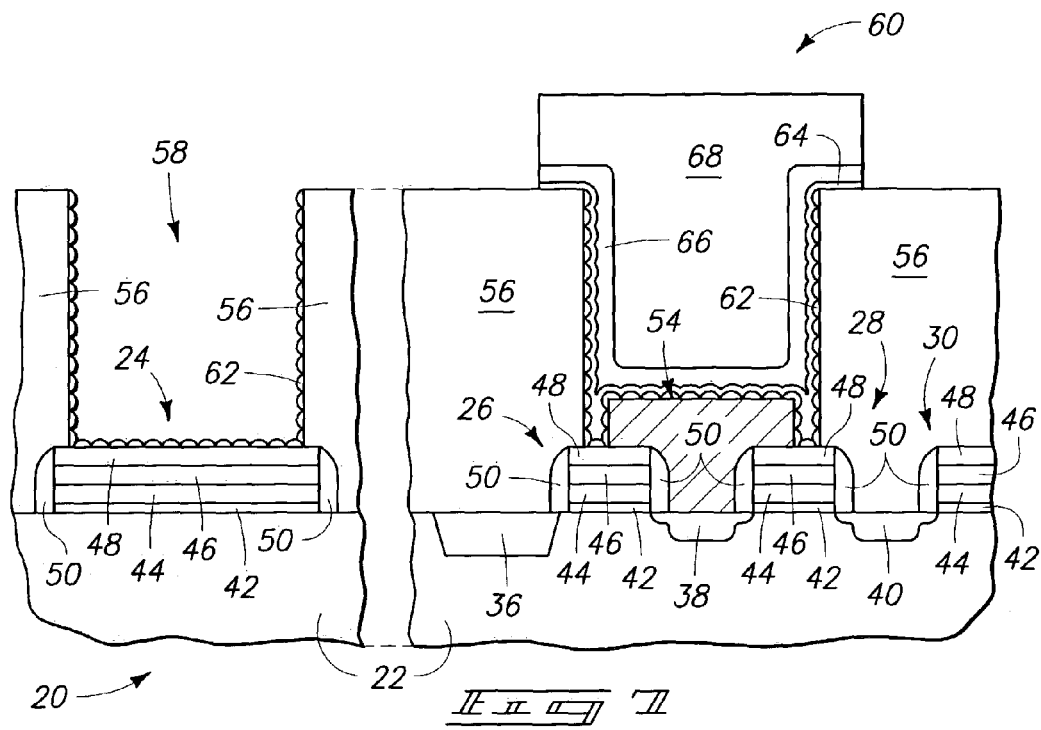
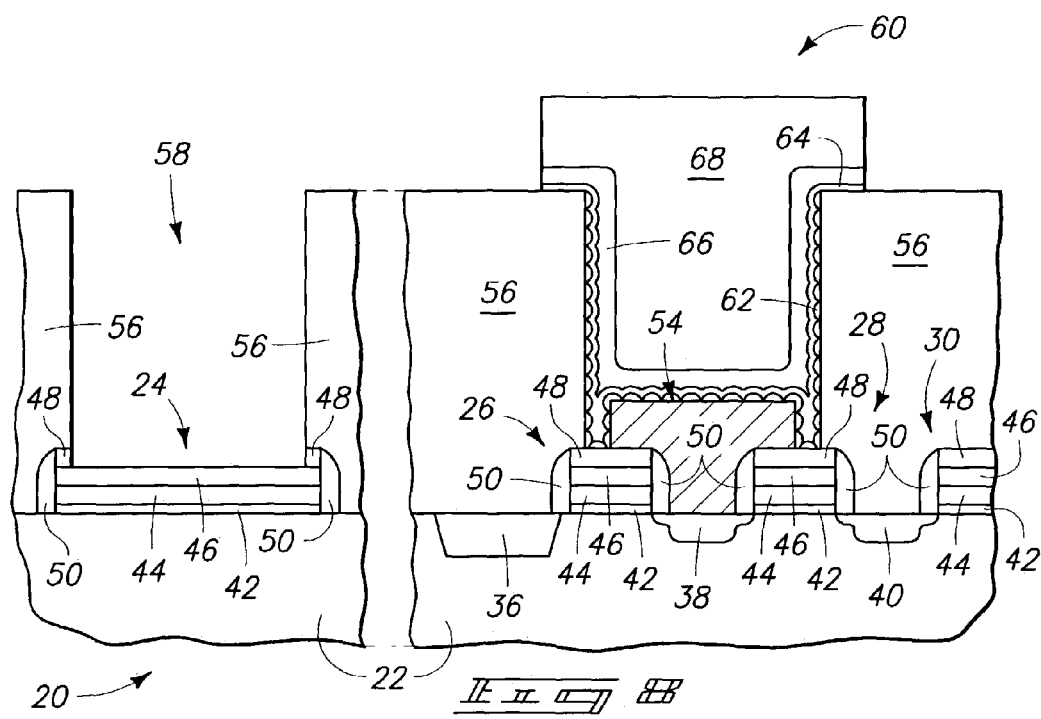

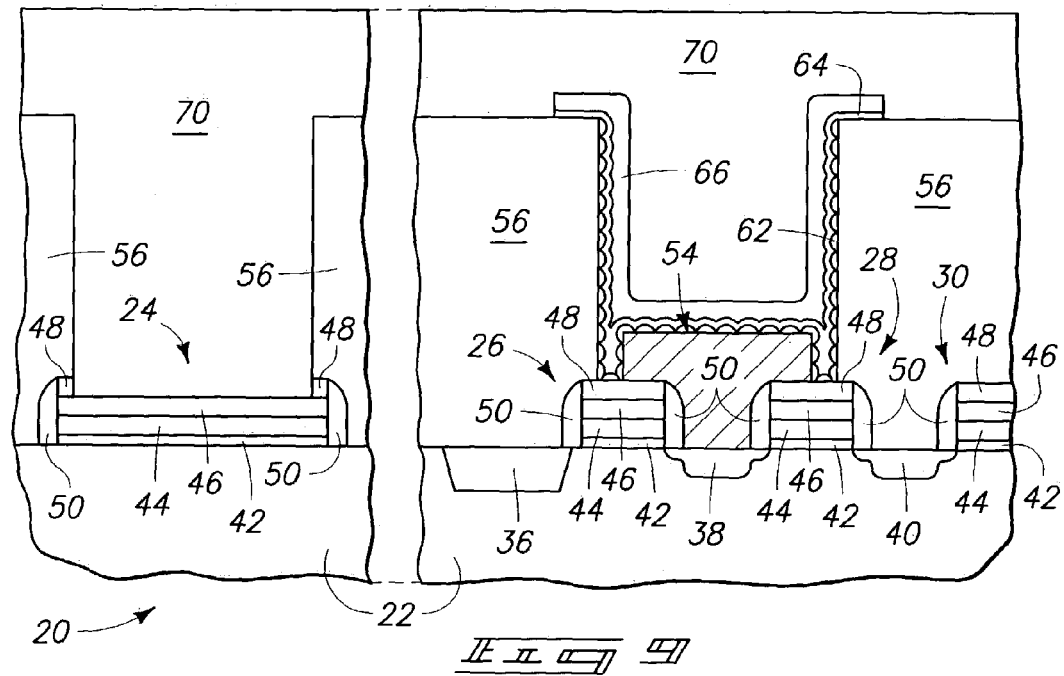
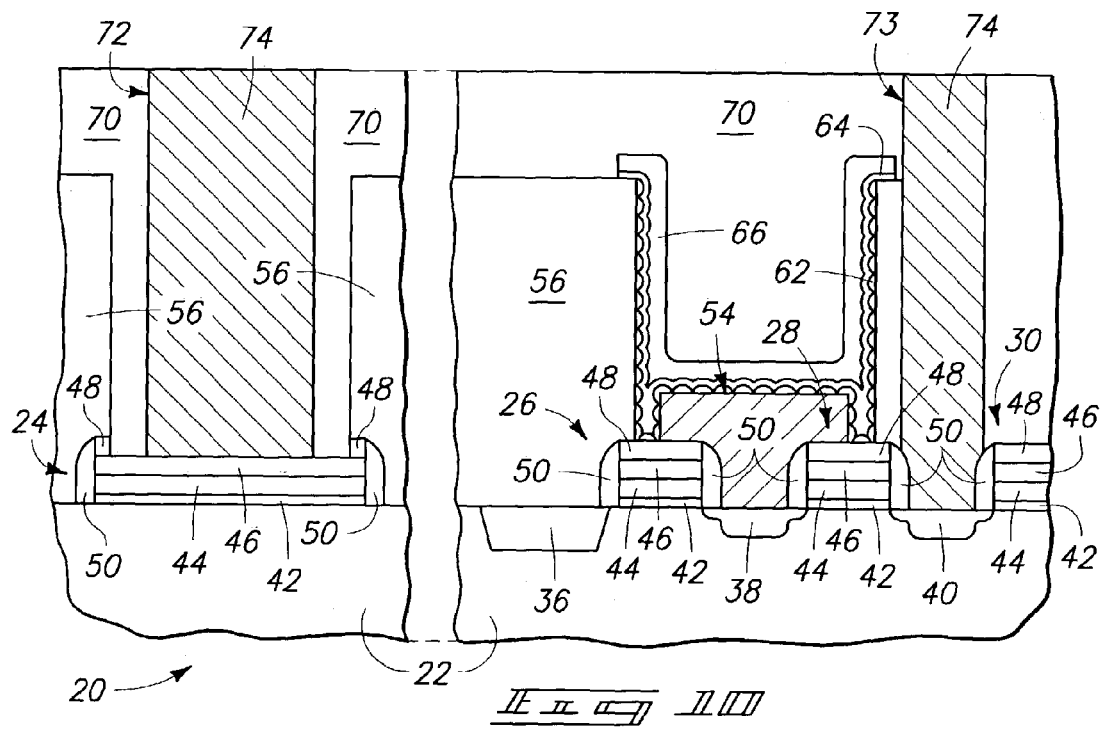

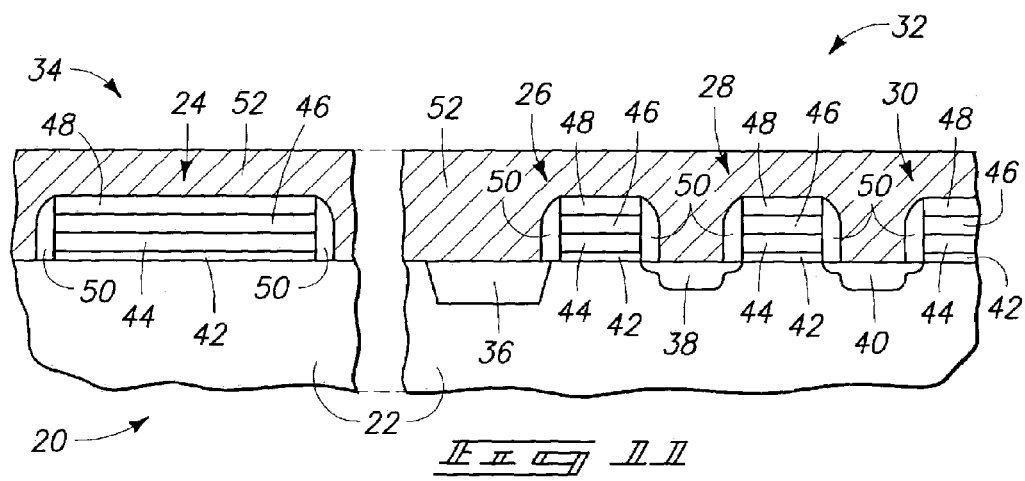
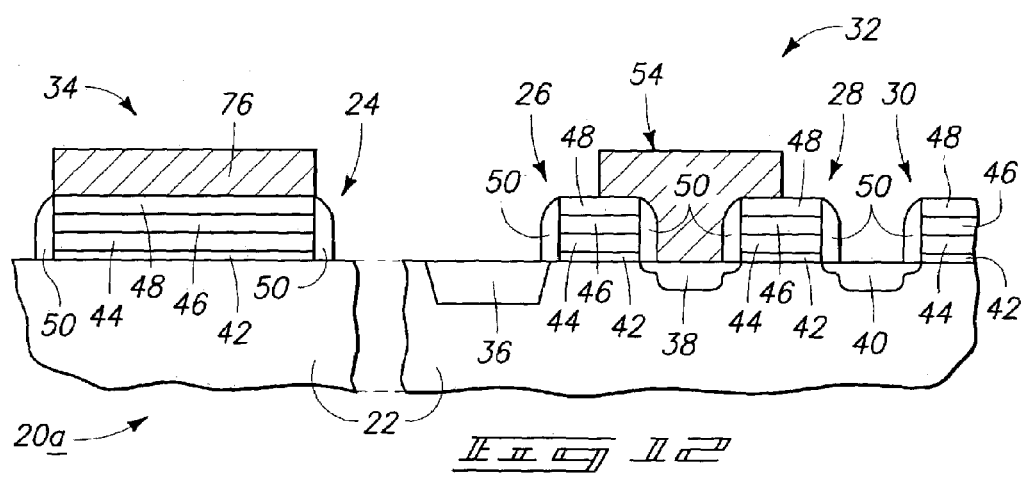

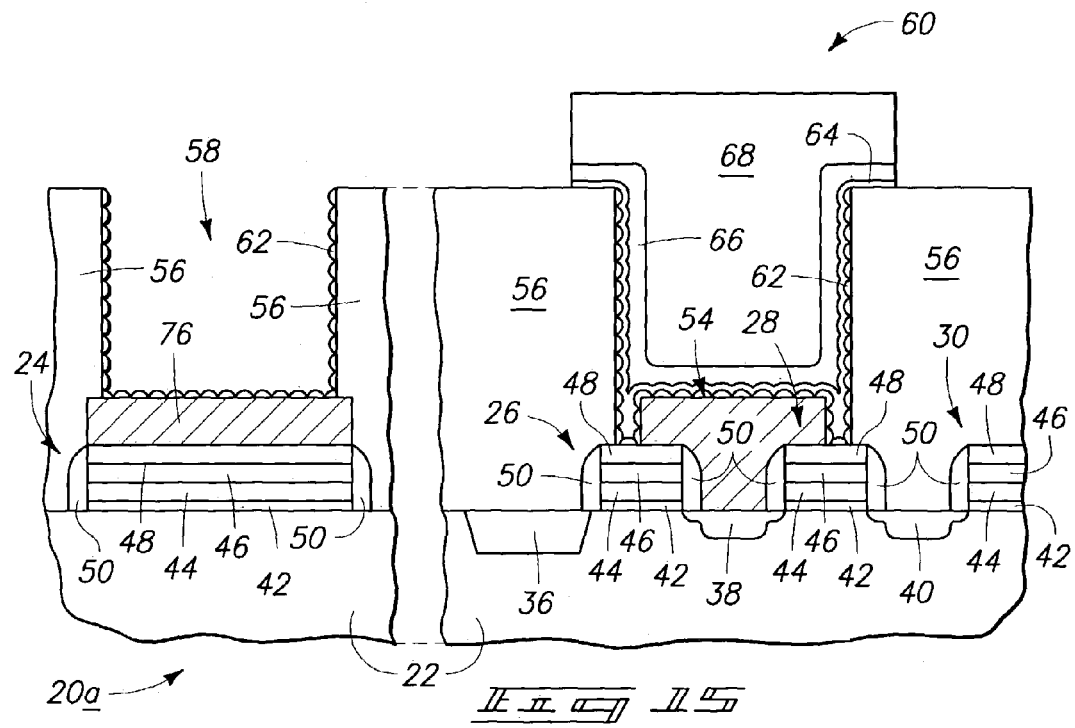
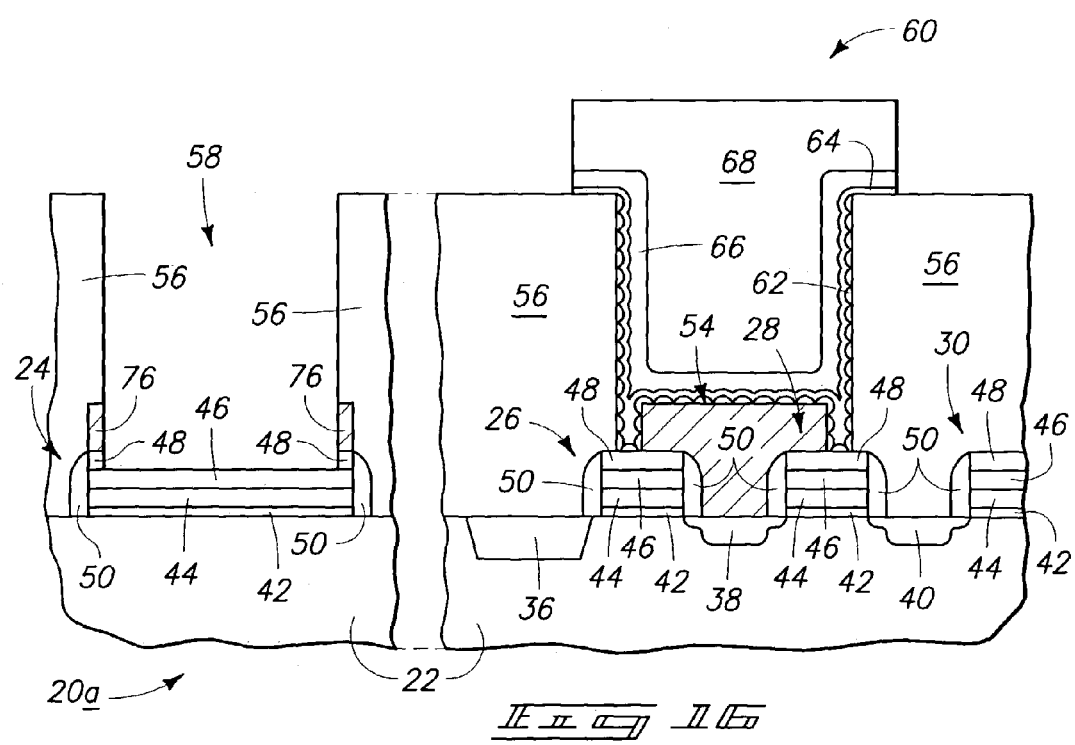

SEMICONDUCTOR PROCESSING METHODS OF FORMING DYNAMIC RANDOM ACCESS MEMORY (DRAM) CIRCUITRY

CROSS REFERENCE TO RELATED APPLICATION

This patent application is a continuation application of Ser. No. 09/139,691, filed Aug. 25, 1998 now U.S. Pat. No. 6,596,577.

TECHNICAL FIELD

This application relates to semiconductor processing methods of forming dynamic random access memory (DRAM) circuitry.

BACKGROUND OF THE INVENTION

Dynamic random access memory (DRAM) circuitry is typically formed by forming a number of different layers of material over a substrate such as a silicon wafer, and then etching such layers into desired substrate features such as conductive word lines, capacitor containers, capacitor structures, and bit lines to name just a few. Efforts continue to be made to reduce the number of processing steps and processing complexity thereof.

This invention arose out of concerns associated with improving the methods through which dynamic random access memory (DRAM) circuitry is formed. This invention also arose out of concerns associated with reducing processing complexities associated with the fabrication of DRAM circuitry.

SUMMARY OF THE INVENTION

Methods of forming dynamic random access memories (DRAM) are described. In one embodiment, an insulative layer is formed over a substrate having a plurality of conductive lines which extend within a memory array area and a peripheral area outward of the memory array. Capacitor container openings and contact openings are contemporaneously etched over the memory array and conductive line portions within the peripheral area respectively.

In another embodiment, a patterned masking layer is formed over a substrate having a plurality of openings formed within an insulative layer, wherein some of the openings comprise capacitor container openings within a memory array and other of the openings comprise conductive line contact openings disposed over conductive lines within a peripheral area outward of the memory array. With a common patterned masking layer, unmasked portions of a capacitor electrode layer are removed within the memory array and material from over portions of the conductive lines within the peripheral area is removed sufficient to expose conductive material of the conductive line portions.

In yet another embodiment, a common etch chemistry is used to remove selected material of an insulative material layer formed over conductive lines within a peripheral area and material of a storage capacitor electrode layer.

In yet another embodiment, a plurality of conductive plugs are formed over substrate node locations over which storage capacitors are to be formed. After forming the plugs, insulative material over conductive lines within a peripheral area is removed to first expose conductive material of the conductive lines.

BRIEF DESCRIPTION OF THE DRAWINGS

Preferred embodiments of the invention are described below with reference to the following accompanying drawings.

FIG. 1 is a diagrammatic side sectional view of a semiconductor wafer fragment in process in accordance with one embodiment of the invention.

FIG. 2 is a view of the FIG. 1 wafer fragment at a processing step which is subsequent to that which is shown in FIG. 1.

FIG. 5 is a view of the FIG. 1 wafer fragment at a processing step which is subsequent to that which is shown in FIG. 4.

FIG. 6 is a view of the FIG. 1 wafer fragment at a processing step which is subsequent, to that which is shown in FIG. 5.

FIG. 7 is a view of the FIG. 1 wafer fragment at a processing step which is subsequent to that which is shown in FIG. 6.

FIG. 8 is a view of the FIG. 1 wafer fragment at a processing step which is subsequent to that which is shown in FIG. 7.

FIG. 9 is a view of the FIG. 1 wafer fragment at a processing step which is subsequent to that which is shown in FIG. 8.

FIG. 10 is a view of the FIG. 1 wafer fragment at a processing step which is subsequent; to that which is shown in FIG. 9.

FIG. 11 is a diagrammatic side sectional view of a semiconductor wafer fragment in process in accordance with another embodiment of the invention.

FIG. 12 is a view of the FIG. 11, wafer fragment at a processing step which is subsequent to that which is shown in FIG. 11.

FIG. 15 is a view of the FIG. 11 wafer fragment at a processing step which is subsequent to that which is shown in FIG. 14.

FIG. 16 is a view of the FIG. 11 wafer fragment at a processing step which is subsequent to that which is shown in FIG. 15.

DETAILED DESCRIPTION OF THE PREFERRED EMBODIMENTS

Figure 3:
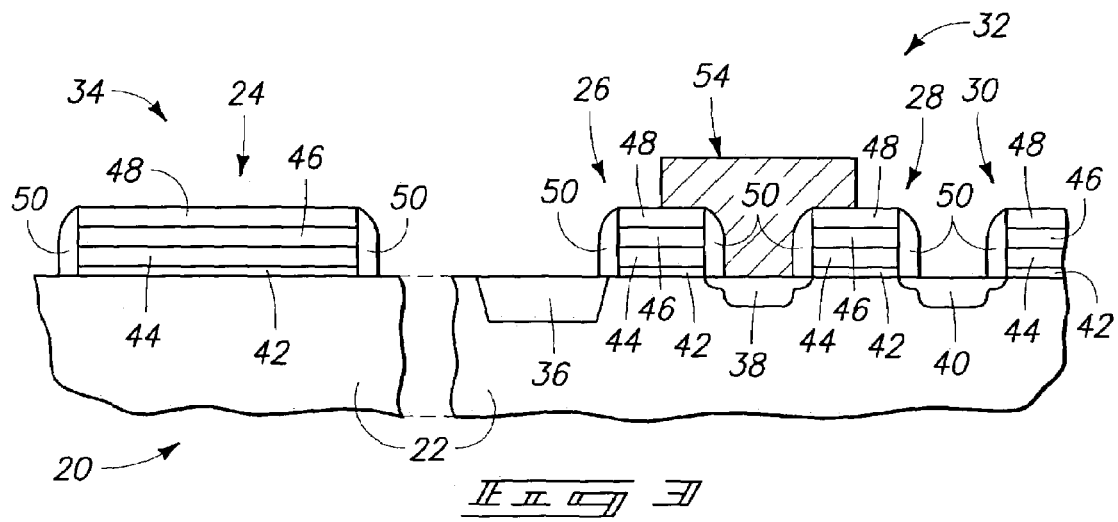
FIG. 3 is a view of the FIG. 1 wafer fragment at a processing step which is subsequent to that which is shown in FIG. 2.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is shown generally at 20 and includes a semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A plurality of conductive lines 24, 26, 28, and 30 are formed over substrate 22. Conductive lines 26, 28, and 30 are formed over or within a memory array area 32, and conductive line 24 is formed over or within a peripheral area 34 outward of memory array area 32. An isolation oxide region 36 is provided within substrate 22, as are diffusion regions 38, 40 which constitute node locations with which electrical communication is desired. The conductive lines typically include a gate oxide layer 42, an overlying polysilicon layer 44, a silicide layer 46, and an insulative material layer or cap 48. For purposes of the ongoing discussion, insulative material layer 48 comprises a first insulative material layer. Exemplary materials for insulative caps 48 include nitrogen-containing material and, in a preferred embodiment, silicon-containing material such as silicon nitride. Sidewall spacers, 50 are provided over conductive lines 24–30. Of course, other conductive line constructions can be utilized.

Referring to FIG. 2, a conductive material layer 52 is formed over substrate 22. An exemplary material is conductively doped polysilicon.

Referring to FIG. 3, a plurality of conductive plugs, such as exemplary conductive plug 54, are formed and received over substrate node locations over which storage capacitors are to be formed.

Figure 4:
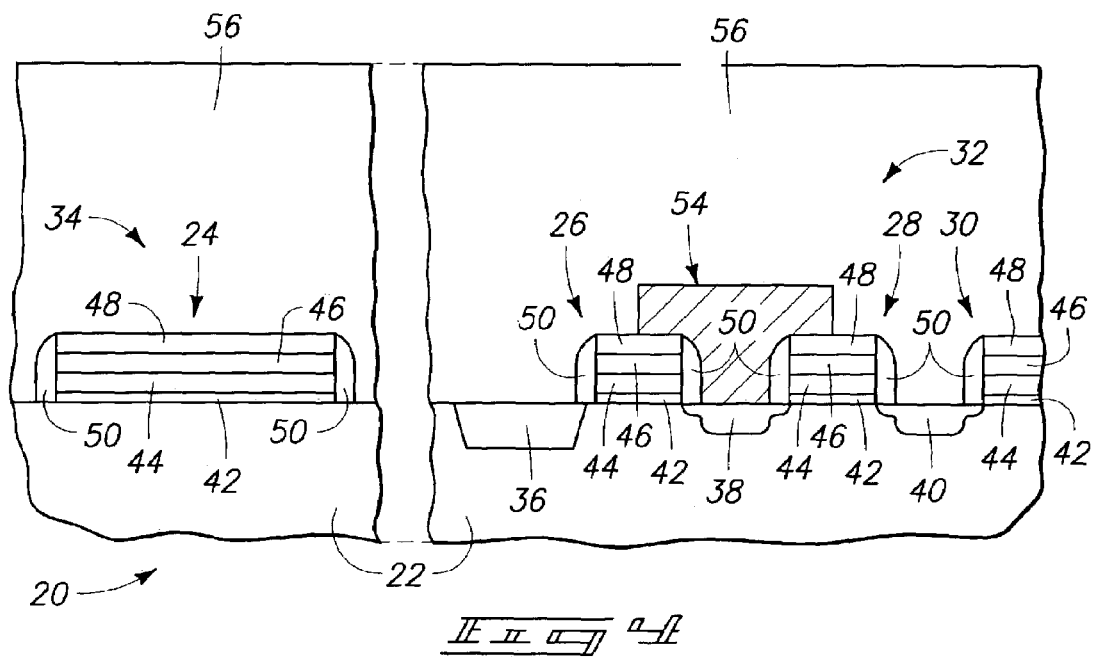
FIG. 4 is a view of the FIG. 1 wafer fragment at a processing step which is subsequent to that which is shown in FIG. 3.

Referring to FIG. 4, an insulative layer 56 is formed over substrate 22 and conductive lines 24–30. For purposes of the ongoing discussion, layer 56 constitutes a second insulative material. An exemplary material is borophosphosilicate glass (BPSG).

Referring to FIG. 5, a plurality of openings 58, 60 are formed and received within insulative layer 56. Opening 58 comprises a contact opening which is formed over insulative cap 48 of conductive line 24, and opening 60 comprises a capacitor container opening within which a storage capacitor is to be formed.

In one embodiment, openings 58, 60 are contemporaneously etched within the memory array area and within the peripheral area. Such openings preferably have substantially the same opening dimensions. Preferably, the openings are etched to expose the insulative caps of one or more of the conductive lines. In this example, the openings within the peripheral area, as initially formed, expose first insulative material cap 48 therewithin, but not conductive material of the conductive lines. Preferably, opening 60 exposes portions of conductive plug 54 within the memory array. For purposes of the ongoing discussion, opening 58 constitutes a first contact opening which is formed over insulative cap 48 within the peripheral area.

Referring to FIG. 6, a conductive material 62 is formed over the substrate and within the openings. In the illustrated example, material 62 comprises a first capacitor electrode layer in the form of a storage node layer which is formed within openings 58, 60. Exemplary materials for layer 62 include conductively doped silicon-containing materials such as polysilicon, hemispherical grain polysilicon or cylindrical grain polysilicon. In this example, hemispherical grain polysilicon is shown. After formation of conductive material 62, selected portions can be removed, as by planarization, to isolate the material within the openings. A dielectric layer 64 is formed over the substrate and within openings 58, 60, and a conductive material 66 is formed over the substrate and within the openings. In the illustrated example, material 66 comprises an outer or second capacitor electrode layer in the form of a cell plate layer which is formed over dielectric layer 64. Collectively, layers 62, 66 constitute a pair of capacitor electrode layers which are formed within openings 58 and 60 and separated by an intervening dielectric region therebetween. A patterned masking layer, 68 is formed over substrate 22 and within capacitor container opening 60. An exemplary material is photoresist.

Referring to FIG. 7, selected unmasked conductive cell plate material of cell plate layer 66 within memory array area 32 is patterned away or otherwise removed, and conductive material from within contact opening 58 (i.e. layer 62) is removed from over a portion of conductive line 24.

Referring to FIG. 8, and with common patterned masking layer 68 in place, remaining unmasked portions of the capacitor electrode layer(s) within the peripheral area are removed as well as insulative material 48 from over conductive line 24. The removal of the insulative material preferably exposes conductive material of conductive line 24, e.g. silicide material 46 and constitutes removing insulative cap portions from over the conductive line portions. Although not specifically shown, the height of layer 56 can be reduced during the removal of the unmasked portions of the capacitor electrode layer(s) within the peripheral area and the insulative material 48 from over conductive line 24.

In a preferred embodiment, the removal of insulative material 48 and conductive material of the capacitor electrode layers is conducted using a common, etch chemistry. For example, where insulative material 48 comprises silicon nitride and the capacitor electrode layers comprise polysilicon, an etch chemistry including $NF_3$ and HBr can be utilized to etch silicon-containing and silicon nitride-containing materials selective to oxides such as BPSG. Accordingly; conductive material is removed from within the memory array contemporaneously with conductive material which is removed from within contact openings 58 within the peripheral area. Hence capacitor electrode material is removed from within contact openings 58 and not from within capacitor container openings 60.

In a preferred embodiment, the removal of insulative material portions 48 from over conductive line 24 constitutes a first-in-time exposure of conductive material of the conductive line in the peripheral area after provision of the insulative material thereover. Alternately considered, substantial portions of individual conductive line insulative caps are removed from the conductive lines which are formed over or within peripheral areas 34. Preferably, the insulative material is removed using an etch chemistry which is also effective to remove both conductive material portions over the first insulative material and the first insulative material.

Referring to FIG. 9, an insulative layer 70 is formed over substrate 22. An exemplary material is BPSG.

Referring to FIG. 10, a contact opening 72 is formed within layer 70 and exposes portions of conductive material 46. Openings 73 within the memory array can also be formed and conductive material 74 formed therein to provide bit line contact plugs. Accordingly, such constitutes, with respect to conductive line 24, forming additional conductive material over and in electrical communication with the conductive line portions which were previously exposed.

Referring to FIG. 11, a semiconductor wafer fragment in process is shown generally at 20a. Like numerals from the above described embodiment have been utilized where appropriate with differences being indicated with the suffix "a" or with different numerals. A conductive material layer 52 is formed over substrate 22.

Referring to FIG. 12, a conductive plug 54 is formed over diffusion region 38, and conductive material 76 is formed or received over portions of some of the conductive lines within peripheral area 34. Accordingly, conductive material is formed over insulative material 48 of conductive line 24.

Figure 13:
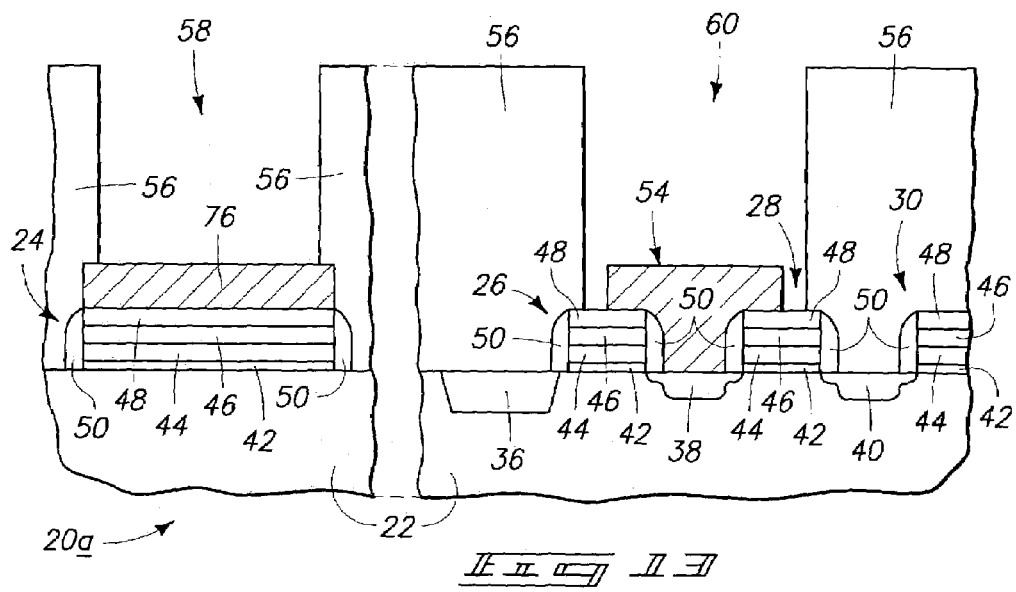
FIG. 13 is a view of the FIG. 11 wafer fragment at a processing step which is subsequent to that which is shown in FIG. 12.

Referring to FIG. 13, an insulative layer 56 is formed over substrate 22 and subsequently openings 58, 60 are etched therethrough. In the illustrated example, openings 58, 60 expose portions of conductive plug 54 and conductive material 76.

Figure 14:
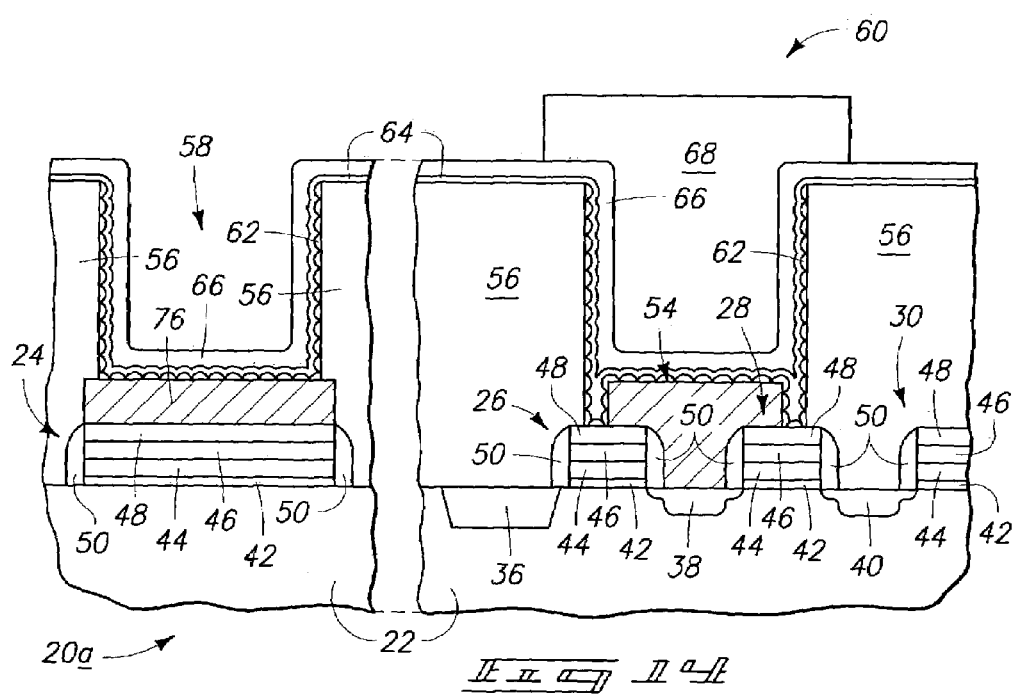
FIG. 14 is a view of the FIG. 11 wafer fragment at a processing step which is subsequent to that which is shown in FIG. 13.

Referring to FIG. 14, capacitor electrode layer 64 is formed over the substrate and within openings 58, 60, a dielectric layer 64 is formed thereover, and an outer or second capacitor electrode layer 66 is formed over the dielectric layer. Patterned masking layer 68 is formed over the substrate.

Referring to FIGS. 15 and 16, unmasked portions of the storage capacitor electrode layers within the memory array and peripheral area are removed sufficiently to form a storage capacitor within the memory array, and to entirely remove the storage capacitor electrode layer from within the peripheral area. Preferably, such removal also outwardly exposes conductive portions of conductive line 24 within a peripheral area. Processing can now take place substantially as described above with respect to FIGS. 9 and 10.

Advantages achieved with the present methods can include reductions in the processing steps required to form memory circuitry, as well as reductions in concerns associated with under-and over-etching substrate portions during fabrication. Other advantages will be apparent to the skilled artisan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a dynamic random access memory (DRAM) comprising:
    forming a plurality of conductive lines over a substrate having a memory array area and a peripheral area outward of the memory array area;
    forming conductive material over the substrate comprising:
        conductive plugs received over substrate node locations over which storage capacitors are to be formed within the memory array area, and
        conductive material received over portions of some of the conductive lines within the peripheral area;
    forming openings through an insulative material and exposing the conductive plugs within the memory array area and the conductive material within the peripheral area;
    forming a storage capacitor electrode layer within the openings;
    removing portions of the storage capacitor electrode layer within the memory array area sufficient to form a storage capacitor electrode within the memory array; and
    entirely removing the storage capacitor electrode layer and at least some of the conductive material received over the conductive lines within the peripheral area and outwardly expose conductive portions of conductive lines within the peripheral area.

2. The method of claim 1, wherein the forming of the storage capacitor electrode layer comprises forming a cell plate layer within the openings.

3. The method of claim 1, wherein the forming of the storage capacitor electrode layer comprises forming a cell plate layer within the openings, and wherein the removing of the storage capacitor electrode layer comprises doing so in a common masking step.

4. The method of claim 1, wherein the forming of the storage capacitor electrode layer comprises forming a cell plate layer within the openings, and wherein the removing of the storage capacitor electrode layer comprises doing so in a common etching step.

5. The method of claim 1, wherein the forming of the storage capacitor electrode layer comprises forming a storage node layer within the openings.

6. The method of claim 1, wherein the forming of the storage capacitor electrode layer comprises forming a storage node layer within the openings, and wherein the removing of the storage capacitor electrode layer comprises doing so in multiple removing steps.

* * * * *

UNITED STATES PATENT AND TRADEMARK OFFICE
CERTIFICATE OF CORRECTION

| | | |
|---|---|---|
| PATENT NO. | : 7,141,472 B2 | |
| APPLICATION NO. | : 10/611602 | |
| DATED | : November 28, 2006 | |
| INVENTOR(S) | : Hermes | |

It is certified that error appears in the above-identified patent and that said Letters Patent is hereby corrected as shown below:

Column 2, Line 34 – Replace "subsequent; to" with --subsequent to--.

Column 4, Line 31 – Replace "common, etch" with --common etch--.

Column 4, Line 37 – Replace "Accordingly;" with --Accordingly,--.

Column 5, Line 31 – Replace "under-and" with --under and--.

Signed and Sealed this

Seventh Day of August, 2007

JON W. DUDAS
*Director of the United States Patent and Trademark Office*